(12) United States Patent
Yamamoto et al.

(10) Patent No.: US 8,260,564 B2
(45) Date of Patent: Sep. 4, 2012

(54) APPARATUS FOR CALCULATING STATE OF CHARGE, METHOD OF CALCULATING STATE OF CHARGE, AND ELECTRIC SYSTEM

(75) Inventors: Masaya Yamamoto, Kasugai (JP); Itaru Seta, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/085,020

(22) Filed: Apr. 12, 2011

(65) Prior Publication Data

US 2011/0257915 A1      Oct. 20, 2011

(30) Foreign Application Priority Data

Apr. 15, 2010   (JP) ................. 2010-094156

(51) Int. Cl.
*G06F 19/00*  (2011.01)
(52) U.S. Cl. .................................................. 702/63
(58) Field of Classification Search ............... 702/63, 702/61, 57; 320/130, 132, 135
See application file for complete search history.

(56) References Cited

U.S. PATENT DOCUMENTS

2006/0076929 A1   4/2006  Tatsumi et al.
2009/0125256 A1   5/2009  Aridome
2010/0019569 A1*  1/2010  Izumi et al. ............. 307/9.1

FOREIGN PATENT DOCUMENTS

| EP | 2 159 099 A1  | 3/2010 |
| JP | 2006-112786 A | 4/2006 |
| JP | 2010-22128 A  | 1/2010 |
| JP | 2010-023715 A | 2/2010 |

OTHER PUBLICATIONS

Extended European Search Report issued Mar. 13, 2012.

* cited by examiner

*Primary Examiner* — Bryan Bui
(74) *Attorney, Agent, or Firm* — Kenyon & Kenyon LLP

(57) ABSTRACT

When the sum of a first state of charge of a first battery stack and a second state of charge of a second battery stack is large, a higher state of charge is selected as a priority state of charge. When the sum of first state of charge of the first battery stack and the second state of charge of the second battery stack is small, a lower state of charge is selected as the priority state of charge. A first coefficient and a second coefficient are set in accordance with the priority state of charge. The second coefficient is set so as to be lower than the first coefficient. The product of the first coefficient and the priority state of charge is added to the product of the second coefficient and the other state of charge, to thereby calculate a state of charge of a power storage system.

7 Claims, 12 Drawing Sheets

FIG.9

| SMAIN | SMN | α | SC-Y/2 | SC | SC+Y/2 | β | SMX |
|---|---|---|---|---|---|---|---|
| SRATE | 0 | α' | 50-X/2 | 50 | 50+X/2 | β' | 100 |
| W1 | B (1≥B>A) | A (A>0.5) | 0.5 | 0.5 | 0.5 | C (C>0.5) | D (1≥D>C) |

APPARATUS FOR CALCULATING STATE OF CHARGE, METHOD OF CALCULATING STATE OF CHARGE, AND ELECTRIC SYSTEM

This nonprovisional application is based on Japanese Patent Application No. 2010-094156 filed on Apr. 15, 2010 with the Japan Patent Office, the entire contents of which are hereby incorporated by reference.

BACKGROUND OF THE INVENTION

1. Field of the Invention

The present invention relates to an apparatus for calculating a state of charge, and more particularly to a technique of calculating a state of charge of a power storage system provided with a first power storage device and a second power storage device.

2. Description of the Background Art

Conventionally, an electric vehicle equipped with an electric motor as a driving source is known. Such a vehicle is equipped with a power storage device that stores electric power, such as a battery and a capacitor. Electric power stored in the power storage device is supplied to the electric motor. The electric motor is controlled so as to output desired power.

One problem with the electric vehicle lies in that the distance that the vehicle can run on a single charge is shorter than in a vehicle having an internal combustion engine as a driving source. One solution for extending the distance that the vehicle can run is to increase the total capacity of the vehicle such as by mounting thereon a plurality of power storage devices, for example.

Another problem with the electric vehicle is to protect a power storage device against overdischarging and overcharging. For example, when the state of charge of the power storage device is low, output power of the electric motor is preferably limited so as to avoid overdischarging. When the state of charge of the power storage device is high, electric power to be charged into the power storage device is preferably limited so as to avoid overcharging. To suitably limit the output power of the electric motor and the electric power to be charged into the power storage device, the state of charge of the power storage device needs to be monitored.

Japanese Patent Laying-Open No. 2006-112786 discloses a state-of-charge detection method of computing the state of charge of a battery as a first state of charge based on integration of current, computing the state of charge of the battery as a second state of charge based on voltage, and computing a synthesized state of charge obtained by a weighted average of the first state of charge and the second state of charge, as a state of charge of the battery.

However, the state-of-charge detection method disclosed in Japanese Patent Laying-Open No. 2006-112786 is intended to calculate the state of charge of a single power storage device, rather than calculating the total state of charge of a power storage system having a plurality of power storage devices. Assuming that a simple total sum of the states of charge of the respective power storage devices is calculated as the total state of charge of the power storage system, the following problem may arise.

For example, in the case where the state of charge of one power storage device is 90% and the state of charge of another power storage device is 60%, electric power to be charged needs to be limited as compared to the case where the states of charge of the two power storage devices are both 75%, even though the total state of charge of the power storage system is the same in both the cases. However, calculating a simple total sum of the states of charge of the respective power storage devices as the total state of charge of the power storage system will make it difficult to distinguish between the case where the respective power storage devices have different states of charge and the case where the two power storage devices have an equal state of charge. It may therefore be difficult to determine that electric power to be charged needs to be limited.

Similarly, in the case where the state of charge of one power storage device is 10% and the state of charge of another power storage device is 40%, electric power to be discharged needs to be limited as compared to the case where the states of charge of the two power storage devices are both 25%, even though the total state of charge of the power storage system is the same in both the cases. However, calculating a simple total sum of the states of charge of the respective power storage devices as the total state of charge of the power storage system will make it difficult to distinguish between the case where the respective power storage devices have different states of charge and the case where the two power storage devices have an equal state of charge. It may therefore be difficult to determine that electric power to be discharged needs to be limited.

SUMMARY OF THE INVENTION

An object of the present invention is to calculate the total state of charge in a power storage system provided with a plurality of power storage devices, taking into consideration the difference between the states of charge of the respective power storage devices.

An apparatus for calculating a state of charge is an apparatus for calculating a state of charge of a power storage system provided with a first power storage device and a second power storage device. The apparatus for calculating includes means for calculating a first state of charge of the first power storage device, means for calculating a second state of charge of the second power storage device, selection means for selecting a higher one of the first state of charge and the second state of charge when a sum of the first state of charge and the second state of charge is larger than or equal to a predetermined first value, and selecting a lower one of the first state of charge and the second state of charge when the sum of the first state of charge and the second state of charge is smaller than the first value, setting means for setting a first coefficient in accordance with a selected state of charge, and setting a second coefficient so as to be lower than the first coefficient, and calculation means for adding a product of the first coefficient and the selected state of charge to a product of the second coefficient and the other state of charge, to thereby calculate the state of charge of the power storage system.

According to this structure, when the sum of the first state of charge of the first power storage device and the second state of charge of the second power storage device is large, the first coefficient and the second coefficient are set in accordance with the higher state of charge. The product of the higher state of charge and the first coefficient is added to the product of the lower state of charge and the second coefficient, to thereby calculate the state of charge of the power storage system. Since the first coefficient is higher than the second coefficient, the state of charge of the power storage system is calculated to be relatively high in accordance with the higher state of charge. In contrast, when the sum of the first state of charge of the first power storage device and second state of charge of second power storage device is small, the first coefficient and the second coefficient are set in accordance with the lower state of charge. The product of the lower state of charge and the first coefficient is added to the product of the higher state of charge and the second coefficient, to thereby calculate the state of charge of the power storage system. Since the first coefficient is higher than the second coefficient, the state of charge of the power storage system is calculated to be relatively low in accordance with the lower state of charge. This enables calculation of the total state of charge taking into consideration the difference between the states of charge of the respective power storage devices.

In an embodiment, the first value is a value twice a predetermined second value. The selection means selects a higher one of the first state of charge and the second state of charge when an arithmetic average value of the first state of charge and the second state of charge is larger than or equal to the second value, and selects a lower one of the first state of charge and the second state of charge when the arithmetic average value of the first state of charge and the second state of charge is smaller than the second value.

According to this structure, when the arithmetic average value of the first state of charge and the second state of charge is larger than or equal to the predetermined second value, the state of charge of the power storage system is calculated to be relatively high. In contrast, when the arithmetic average value of the first state of charge and the second state of charge is smaller than the second value, the state of charge of the power storage system is calculated to be relatively low. This enables early detection that the state of charge is high when the arithmetic average value of the first state of charge and the second state of charge is larger than or equal to the second value, and enables early detection that the state of charge is low when the arithmetic average value of the first state of charge and the second state of charge is smaller than the second value.

In another embodiment, the setting means sets the first coefficient and the second coefficient to be equal when the selected state of charge falls within a predetermined range where the second value is centered.

According to this structure, when the selected state of charge falls within the predetermined range where the second value is centered, the first coefficient and the second coefficient are equal. Therefore, if both the first state of charge and the second state of charge fall within the predetermined range when the selected state of charge is changed, the calculated state of charge of the power storage system can be equal before and after the selected state of charge is changed. This can ensure continuousness of the calculated state of charge of the power storage system.

In yet another embodiment, when a first difference between the first state of charge and the second state of charge is larger than a width of the predetermined range, the setting means sets the first coefficient and the second coefficient in accordance with a value obtained by correcting the selected state of charge so as to approach the second value in accordance with a second difference between the first difference and the width of the predetermined range.

According to this structure, the first coefficient and the second coefficient are set to be equal by correcting the selected state of charge so as to fall within the predetermined range even if the selected state of charge falls outside the predetermined range. Therefore, by correcting the selected state of charge so as to fall within the predetermined range even if both the first state of charge and the second state of charge fall outside the predetermined range when the selected state of charge is changed, the calculated state of charge of the power storage system can be equal before and after the selected state of charge is changed. This can ensure continuousness of the calculated state of charge of the power storage system.

In yet another embodiment, the setting means sets the first coefficient and the second coefficient such that the first coefficient increases and the second coefficient decreases as a difference between the selected state of charge and the second value increases.

According to this structure, when the sum of the first state of charge of the first power storage device and the second state of charge of the second power storage device is large, the state of charge of the power storage system is calculated to be higher as the higher state of charge is closer to the upper limit value. In contrast, when the sum of the first state of charge and the second state of charge is small, the state of charge of the power storage system is calculated to be lower as the lower state of charge is closer to the lower limit value. This allows the calculated state of charge to show that one state of charge is close to the upper limit value or the lower limit value.

In yet another embodiment, the second value is an arithmetic average value of an upper limit value and a lower limit value of the states of charge of the first power storage device and the second power storage device.

This structure allows a determination to be made whether the arithmetic average value of the first state of charge of the first power storage device and the second state of charge of the second power storage device is large or small relative to the arithmetic average value of the upper limit value and the lower limit value of the states of charge.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram illustrating a map used for setting a first coefficient W1.

DESCRIPTION OF THE PREFERRED EMBODIMENTS

Figure 1:
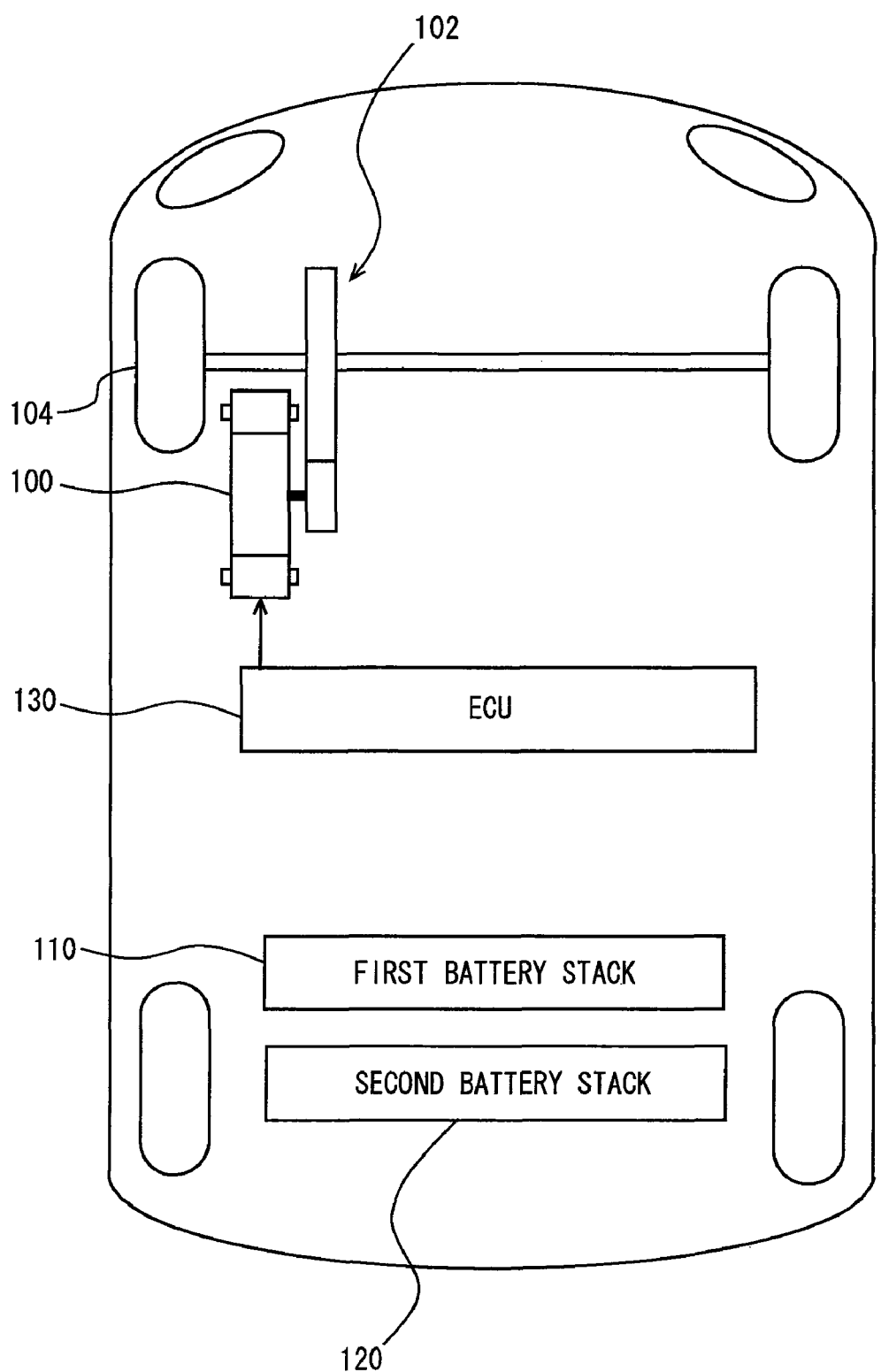
FIG. 1 is a schematic structural diagram illustrating an electric vehicle.

The embodiments of the present invention will be hereinafter described with reference to the accompanying drawings, in which the same components are designated by the same reference characters. Names and functions thereof are the same, and therefore, description thereof will not be repeated.

Referring to FIG. 1, an electric vehicle will be described. This electric vehicle is equipped with an electric motor 100, a first battery stack 110 and a second battery stack 120. The electric vehicle runs using electric motor 100 as a driving source supplied with electric power from first battery stack 110 and second battery stack 120. A hybrid vehicle equipped with an internal combustion engine in addition to electric motor 100 may be employed instead.

Electric motor 100 is controlled by an ECU (Electronic Control Unit) 130. ECU 130 may be divided into a plurality of ECUs.

Electric motor 100 is a three-phase alternating-current rotating electric machine having a U-phase coil, a V-phase coil and a W-phase coil. Electric motor 100 is driven by electric power stored in first battery stack 110 and second battery stack 120.

The driving force of electric motor 100 is transmitted to a driving wheel 104 via a reduction gear 102. Electric motor 100 thereby causes the vehicle to run During regenerative braking of the electric vehicle, electric motor 100 is driven by driving wheel 104 via reduction gear 102 to thereby operate electric motor 100 as a power generator. Accordingly, electric motor 100 operates as a regenerative brake for converting braking energy into electric power. The electric power generated by electric motor 100 is stored in first battery stack 110 and second battery stack 120.

Each of first battery stack 110 and second battery stack 120 serves as a battery set having a configuration in which a plurality of battery modules each having a plurality of battery cells integrated with each other are connected in series. First battery stack 110 and second battery stack 120 are connected in parallel to each other. First battery stack 110 and second battery stack 120 are charged with electric power supplied from a power supply outside the vehicle, in addition to electric motor 100.

First battery stack 110 and second battery stack 120 are equal or substantially equal in capacity (a maximum charge amount that is rechargeable). The power storage system of the electric vehicle includes first battery stack 110 and second battery stack 120.

Figure 2:
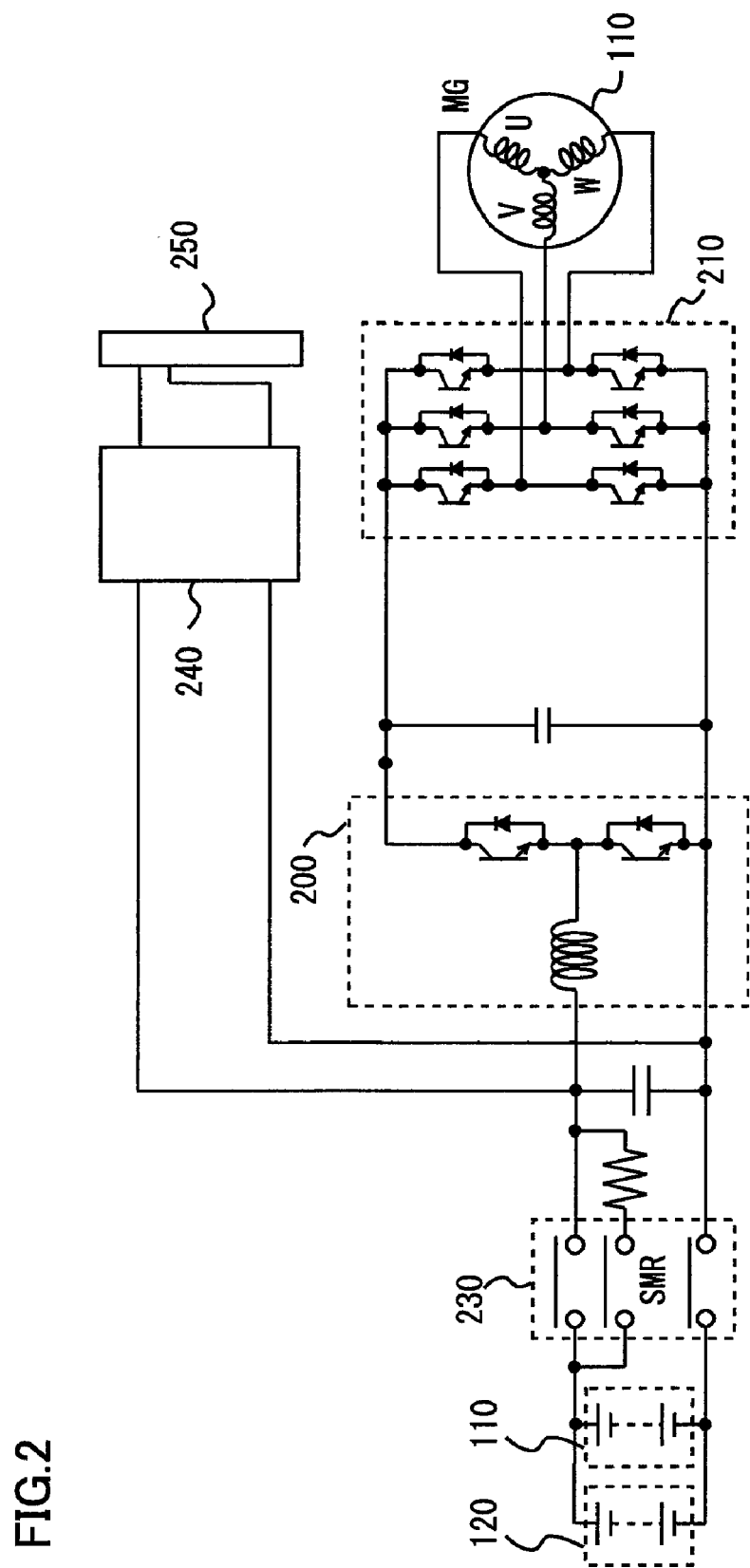
FIG. 2 is a (first) diagram illustrating an electric system of the electric vehicle.

With reference to FIG. 2, the electric system of the electric vehicle will now be described further. The electric vehicle is provided with a converter 200, an inverter 210, a system main relay 230, a charger 240, and an inlet 250.

Converter 200 includes a reactor, two npn-type transistors and two diodes. The reactor has its one end connected to the positive terminal side of each battery, and the other end connected to a connection point between the two npn-type transistors.

The two npn-type transistors are connected in series. The npn-type transistors are controlled by ECU 130. The diodes are respectively connected between the collector and the emitter of the respective npn-type transistors so as to flow current from the emitter to the collector.

The npn-type transistors may be implemented by IGBTs (Insulated Gate Bipolar Transistors). Instead of the npn-type transistors, power-switching elements such as power MOSFETs (Metal Oxide Semiconductor Field-Effect Transistors) can be used.

When electric power discharged from first battery stack 110 and second battery stack 120 is supplied to electric motor 100, converter 200 boosts the voltage. In contrast, when electric power generated by electric motor 100 is charged into first battery stack 110 and second battery stack 120, converter 200 down-converts the voltage.

Inverter 210 has a U-phase arm, a V-phase arm and a W-phase arm. The U-phase arm, V-phase arm and W-phase arm are connected in parallel. The U-phase arm, V-phase arm and W-phase arm each have two npn-type transistors connected in series. Between the collector and the emitter of each of the npn-type transistors, a diode is connected which flows current from the emitter to the collector. The connection point between the respective npn-type transistors in each arm is connected to an end of each coil of electric motor 100 other than the neutral point.

Inverter 210 converts a DC current supplied from first battery stack 110 and second battery stack 120 into an AC current for supply to electric motor 100. Inverter 210 also converts an AC current generated by electric motor 100 into a DC current.

System main relay 230 is provided between first battery stack 110 and converter 200. When system main relay 230 is opened, first battery stack 110 and second battery stack 120 are disconnected from the electric system. When system main relay 230 is closed, first battery stack 110 and second battery stack 120 are connected to the electric system.

The state of system main relay 230 is controlled by ECU 130. For example, when ECU 130 is activated, system main relay 230 is closed. When ECU 1.30 stops, system main relay 230 is opened.

Figure 3:
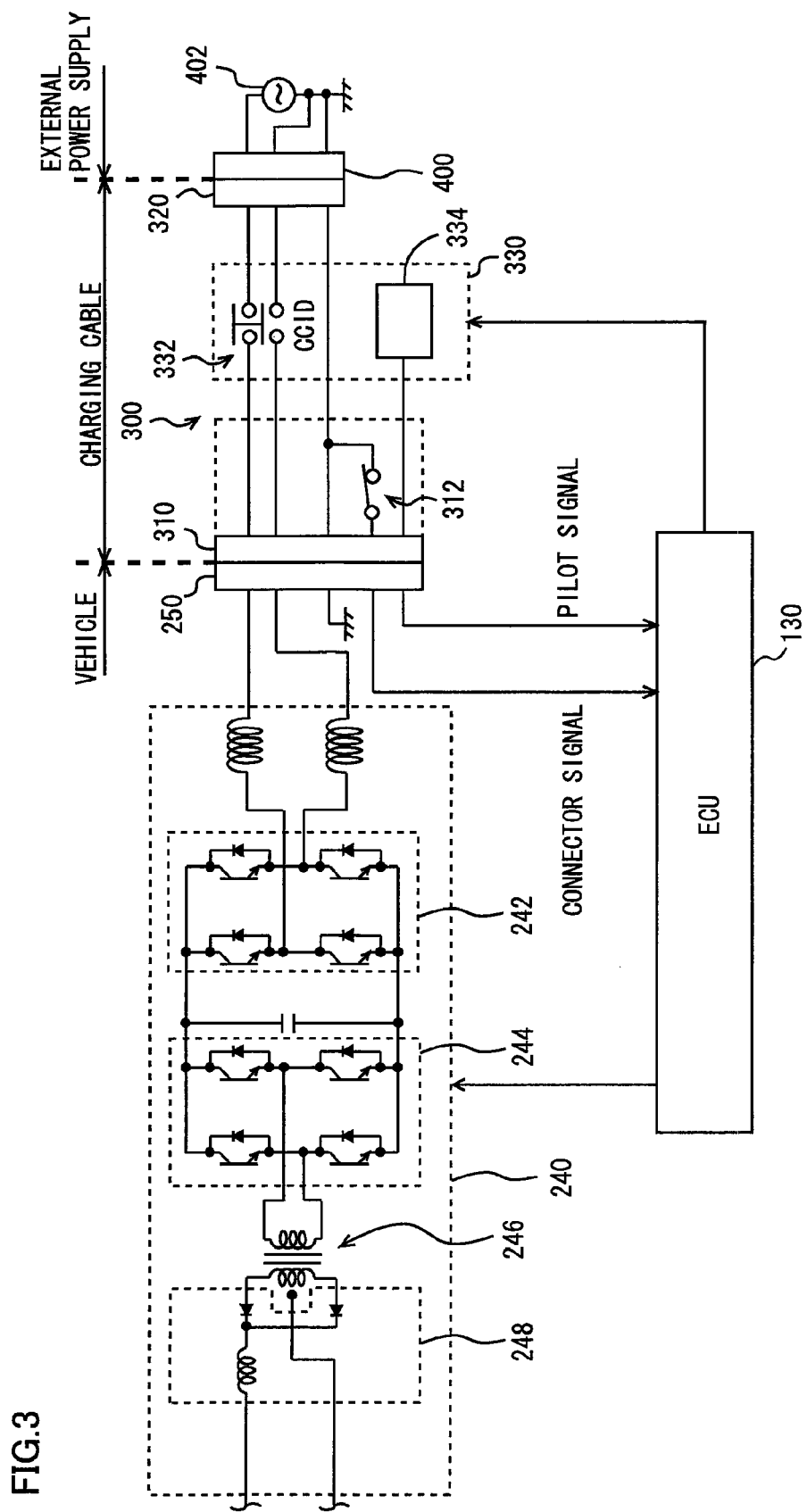
FIG. 3 is a (second) diagram illustrating the electric system of the electric vehicle.

Charger 240 is connected between system main relay 230 and converter 200. As shown in FIG. 3, charger 240 includes an AC/DC conversion circuit 242, a DC/AC conversion circuit 244, an insulation transformer 246, and a rectifier circuit 248.

AC/DC conversion circuit 242 is formed of a single-phase bridge circuit. AC/DC conversion circuit 242 converts AC power into DC power based on a driving signal from ECU 130. AC/DC conversion circuit 242 also serves as a boost chopper circuit that boosts the voltage by using the coils as the reactor.

DC/AC conversion circuit 244 is formed of a single-phase bridge circuit. DC/AC conversion circuit 244 converts DC power into high frequency AC power for output to insulation transformer 246, based on a driving signal from ECU 130.

Insulation transformer 246 includes a core made of a magnetic material, and a primary coil and a secondary coil wound around the coil. The primary coil and secondary coil are electrically insulated, and connected to DC/AC conversion circuit 244 and rectifier circuit 248, respectively. Insulation transformer 246 converts the high frequency AC power received from DC/AC conversion circuit 244 to assume a voltage level in accordance with a turn ratio of the primary coil and the secondary coil for output to rectifier circuit 248. Rectifier circuit 248 rectifies the AC power received from insulation transformer 246 into DC power.

When first battery stack 110 and second battery stack 120 are charged from the power supply outside the vehicle, ECU 130 generates a driving signal for driving charger 240 for output to charger 240.

Inlet 250 is provided on a side face of the electric vehicle, for example. A connector 310 of charging cable 300 coupling the electric vehicle and an external power supply 402 is connected to inlet 250.

Charging cable 300 coupling the electric vehicle and external power supply 402 includes connector 310, a plug 320, and a COD (Charging Circuit Interrupt Device) 330.

Connector 310 of charging cable 300 is connected to inlet 250 provided on the electric vehicle. Connector 310 is provided with a switch 312. When switch 312 is closed with connector 310 of charging cable 300 being connected to inlet 250 provided on the electric vehicle, ECU 130 receives a connector signal CNCT indicating that connector 310 of charging cable 300 is connected to inlet 250 provided on the electric vehicle.

Switch 312 opens and closes in coordination with an anchor fitting anchoring connector 310 of charging cable 300 to inlet 250 of the electric vehicle. The anchor fitting swings by a user pressing a button provided on connector 310.

Figure 4:
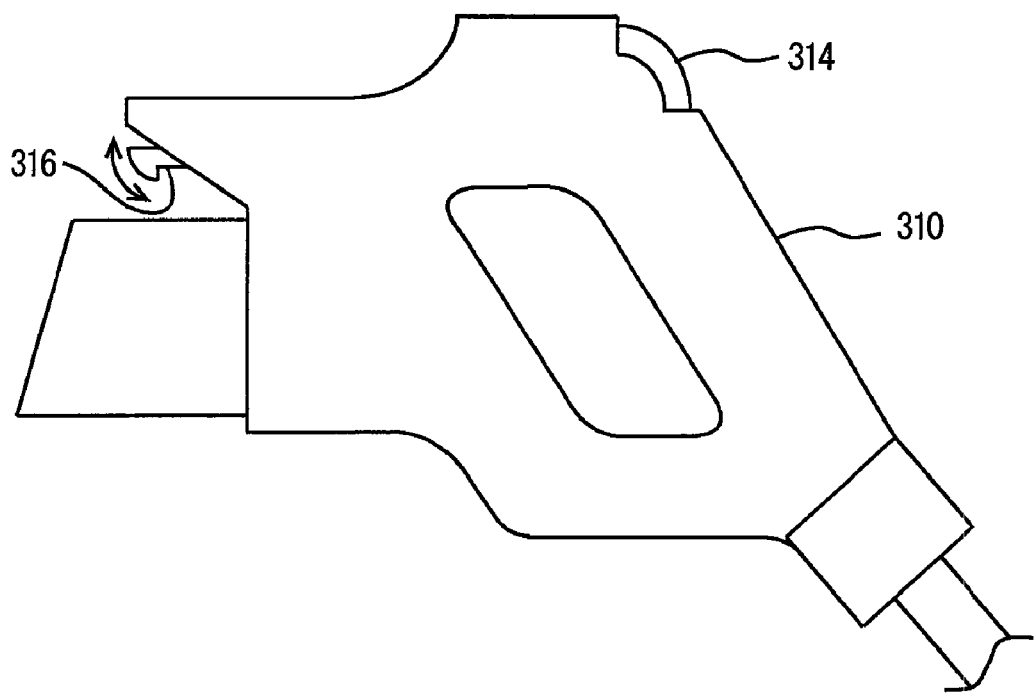
FIG. 4 is a diagram illustrating a connector of a charging cable.

For example, when the user moves the finger off a button 314 of connector 310 shown in FIG. 4 with connector 310 of charging cable 300 being connected to inlet 250 provided on the electric vehicle, an anchor fitting 316 engages with inlet 250 provided on the electric vehicle, and switch 312 is closed. When the user presses button 314, anchor fitting 316 is disengaged from inlet 250, and switch 312 is opened. It is to be noted that the method of opening and closing switch 312 is not limited thereto.

Referring back to FIG. 3, plug 320 of charging cable 300 is connected to an outlet 400 provided at a house. AC power is supplied from power supply 402 outside the electric vehicle to outlet 400.

CCID 330 has a relay 332 and a control pilot circuit 334. In the state where relay 332 is opened, the path is interrupted through which the electric power is supplied from power supply 402 outside the electric vehicle to the electric vehicle. In the state where relay 332 is closed, the electric power can be supplied from power supply 402 outside the electric vehicle to the electric vehicle. ECU 130 controls the state of relay 332 with connector 310 of charging cable 300 being connected to inlet 250 of the electric vehicle.

Control pilot circuit 334 transmits a pilot signal (square wave signal) CPLT to a control pilot line with plug 320 of charging cable 300 being connected to outlet 400, that is, external power supply 402, and with connector 310 being connected to inlet 250 provided on the electric vehicle. The pilot signal is oscillated by an oscillator provided in control pilot circuit 334.

When plug 320 of charging cable 300 is connected to outlet 400, control pilot circuit 334 may output a constant pilot signal CPLT even if connector 310 is disconnected from inlet 250 provided on the electric vehicle. However, ECU 130 cannot detect pilot signal CPLT output with connector 310 being disconnected from inlet 250 provided on the electric vehicle.

When plug 320 of charging cable 300 is connected to outlet 400 and connector 310 is connected to inlet 250 of the electric vehicle, control pilot circuit 334 oscillates pilot signal CPLT of a predetermined pulse width (duty cycle).

The electric vehicle is notified of the current capacity that can be supplied, in accordance with the pulse width of pilot signal CPLT. For example, the electric vehicle is notified of the current capacity of charging cable 300. The pulse width of pilot signal CPLT is constant independently of the voltage and the current of external power supply 402.

In the case where a different charging cable is used, the pulse width of pilot signal CPLT may vary. In other words, the pulse width of pilot signal CPLT may be set for each type of the charging cables.

In the present embodiment, the electric power supplied from external power supply 402 is charged into first battery stack 110 and second battery stack 120 with the electric vehicle and external power supply 402 being coupled to each other by charging cable 300. During charging of first battery stack 110 and second battery stack 120, system main relay 230 and relay 332 in COD 330 are closed.

Figure 5:
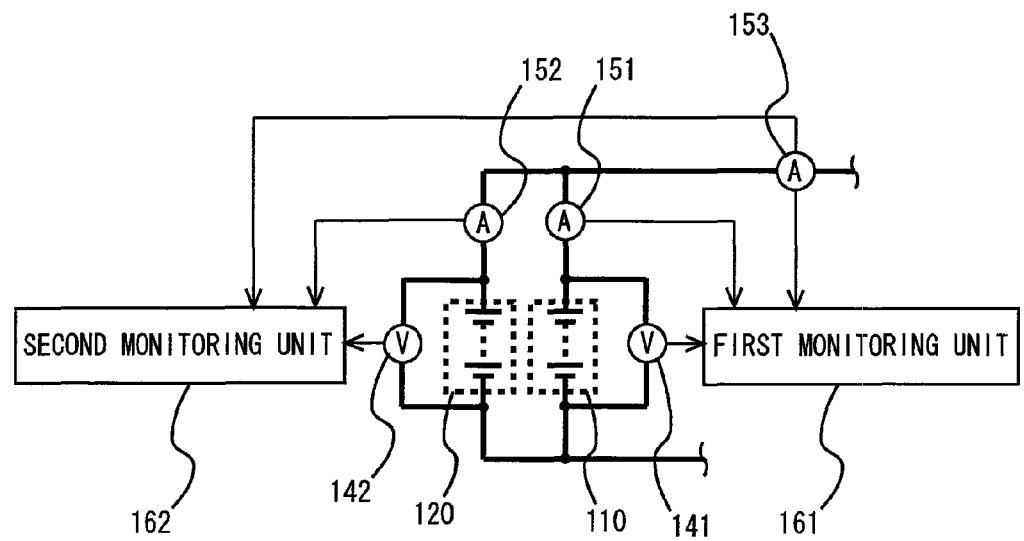
FIG. 5 is a diagram illustrating a power storage system.

With reference to FIG. 5, the power storage system will be described further. The power storage system includes first battery stack 110 and second battery stack 120. First battery stack 110 and second battery stack 120 are connected in parallel to each other. Alternatively, three or more battery stacks may be provided.

The voltage of first battery stack 110 is detected by a voltage sensor 141. The voltage of second battery stack 120 is detected by a voltage sensor 142.

The input and output current of first battery stack 110 is detected by a current sensor 151. The input and output current of second battery stack 120 is detected by a current sensor 152. An overall input and output current of first battery stack 110 and second battery stack 120, that is, the sum of the input and output current of first battery stack 110 and the input and output current of second battery stack 120 is detected by a current sensor 153.

First battery stack 110 and second battery stack 120 are not always equal in input and output current, since they are connected in parallel to each other. Accordingly, a first state of charge (SOC) S1 of first battery stack 110 and a second SOC S2 of second battery stack 120 may be different from each other. In the present embodiment, first SOC S1 of first battery stack 110 and second SOC S2 of second battery stack 120 are calculated individually.

First SOC S1 of first battery stack 110 is calculated by a first monitoring unit 161. First monitoring unit 161 calculates the SOC of first battery stack 110 based on the voltage of first battery stack 110, the input and output current of first battery stack 110, the overall input and output current of first battery stack 110 and second battery stack 120, and the like.

Similarly, second SOC S2 of second battery stack 120 is calculated by a second monitoring unit 162. Second monitoring unit 162 calculates the SOC of second battery stack 120 based on the voltage of second battery stack 120, the input and output current of second battery stack 120, the overall input and output current of first battery stack 110 and second battery stack 120, and the like.

First monitoring unit 161 and second monitoring unit 162 may be implemented as part of ECU 130. Since the SOC of each battery stack may be calculated using a well-known general technique, detailed description thereof will not be repeated.

In the present embodiment, ECU 130 receives data indicating the SOC of each battery stack. ECU 130 calculates the overall SOC, that is, a total SOC STOTAL of the power storage system.

ECU 130 controls charging of first battery stack 110 and second battery stack 120 using total SOC STOTAL of the power storage system. For example, when total SOC STOTAL of the power storage system is high, charging of first battery stack 110 and second battery stack 120 is limited.

ECU 130 controls discharging from first battery stack 110 and second battery stack 120 using total SOC STOTAL of the power storage system. For example, when total SOC STO- TAL of the power storage system is low, discharging from first battery stack 110 and second battery stack 120 is limited.

Further, ECU 130 calculates the distance that the electric vehicle can run using total SOC STOTAL of the power storage system. For example, the distance that the electric vehicle can run until total SOC STOTAL falls below a threshold value is calculated from the present value and the rate of change of total SOC STOTAL, the vehicle speed, and the like.

Control using total SOC STOTAL of the power storage system is not limited thereto.

Figure 6:
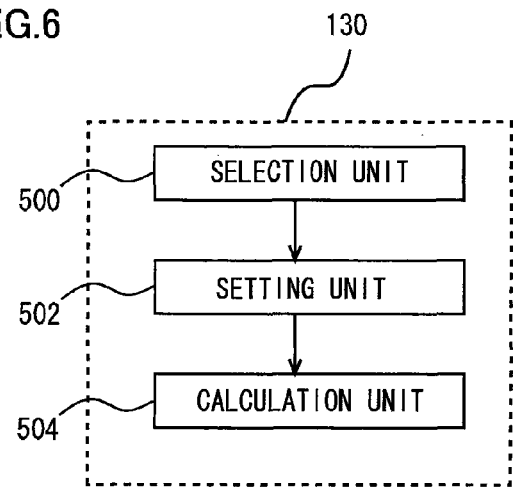
FIG. 6 is a functional block diagram illustrating ECU.

With reference to FIG. 6, the function of ECU 130 that calculates total SOC STOTAL of the power storage system will be described further. The function, which will be described below, may be implemented either by software or hardware.

ECU 130 includes a selection unit 500, a setting unit 502 and a calculation unit 504.

When the sum of first SOC S1 of first battery stack 110 and second SOC S2 of second battery stack 120 is larger than or equal to a predetermined first value which is, for example, the sum of an upper limit value SMX and a lower limit value SMN of the SOCs of first battery stack 110 and second battery stack 120, selection unit 500 selects a higher one of first SOC S1 of first battery stack 110 and second SOC S2 of second battery stack 120 as a priority SOC SMAIN. In contrast, when the sum of first SOC S1 of first battery stack 110 and second SOC S2 of second battery stack 120 is smaller than the sum of upper limit value SMX and lower limit value SMN, a lower one of first SOC S1 of first battery stack 110 and second SOC S2 of second battery stack 120 is selected as priority SOC SMAIN.

More specifically, a determination is made whether the arithmetic average value of first SOC S1 of first battery stack 110 and second SOC S2 of second battery stack 120 is larger than or equal to a predetermine second value which is, for example, a central value SC of the SOCs. Central value SC of the SOCs is, in other words, the arithmetic average value of upper limit value SMX and lower limit value SMN of the SOCs of first battery stack 110 and second battery stack 120. Therefore, the sum of upper limit value SMX and lower limit value SMN is twice central value SC. The determination whether the arithmetic average value of first SOC S1 of first battery stack 110 and second SOC S2 of second battery stack 120 is larger than or equal to central value SC of the SOCs refers to a determination whether the sum of first SOC S1 of first battery stack 110 and second SOC S2 of second battery stack 120 is larger than or equal to the sum of upper limit value SMX and lower limit value SMN. Upper limit value SMX and lower limit value SMN are predetermined by a developer such that a SOC usage range is defined.

Figure 7:
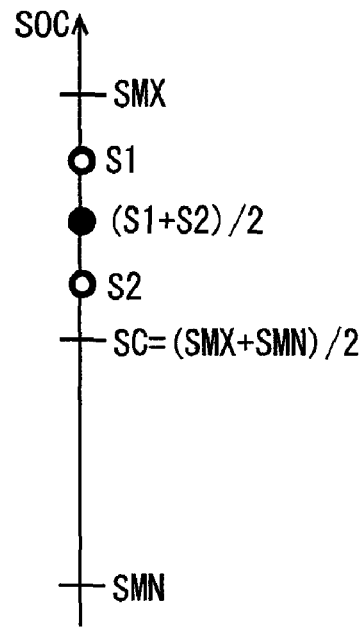
FIG. 7 is a (first) diagram illustrating a first state of charge S1 of a first battery stack and a second state of charge S2 of a second battery stack.

As shown in FIG. 7, when the arithmetic average value of first SOC 51 of first battery stack 110 and second SOC S2 of second battery stack 120 is larger than or equal to central value SC, a higher one of first SOC S1 of first battery stack 110 and second SOC S2 of second battery stack 120 is selected as priority SOC SMAIN. In the example shown in FIG. 7, first SOC S1 of first battery stack 110 is selected.

Figure 8:
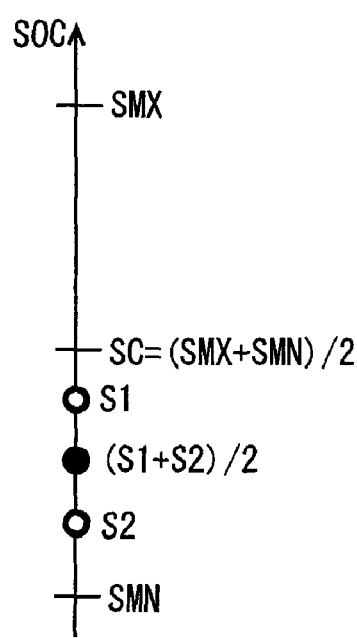
FIG. 8 is a (second) diagram illustrating first state of charge S1 of the first battery stack and second state of charge S2 of the second battery stack.

As shown in FIG. 8, when the arithmetic average value of first SOC S1 of first battery stack 110 and second SOC S2 of second battery stack 120 is smaller than central value SC, a lower one of first SOC S1 of first battery stack 110 and second SOC S2 of second battery stack 120 is selected as priority SOC SMAIN. In the example shown in FIG. 8, first SOC S2 of second battery stack 120 is selected.

The other SOC, that is, the SOC not selected is used as a sub SOC SSUB when calculating the total SOC of the power storage system.

Referring back to FIG. 6, setting unit 502 sets a first coefficient W1 in accordance with priority SOC SMAIN, and sets a second coefficient W2 so as to be lower than or equal to first coefficient W1. In the present embodiment, first coefficient W1 and second coefficient W2 are set such that first coefficient W1+second coefficient W2=1 holds. That is, W2=1−W1 holds. In addition, $0.5 \leq$ first coefficient $W1 \leq 1$ holds. Accordingly, $0 \leq$ second coefficient $W2 \leq 0.5$ holds.

As shown in FIG. 9, first coefficient W1 is set in accordance with a map created based on the results of experiments and simulations, and the like. Setting is made such that, as the difference between priority SOC SMAIN and central value SC increases, first coefficient W1 increases, that is, second coefficient W2 decreases. In other words, setting is made such that, as priority SOC SMAIN approaches upper limit value SMX of SOC, first coefficient W1 increases and second coefficient W2 decreases. Similarly, setting is made such that, as priority SOC SMAIN approaches lower limit value SMN of SOC, first coefficient W1 increases and second coefficient W2 decreases.

In the case where priority SOC SMAIN falls within a predetermined range where central value SC is centered, first coefficient W1 and second coefficient W2 are set to be equal. In the present embodiment, first coefficient W1 and second coefficient W2 are both set at 0.5. Outside this range, second coefficient W2 is set to be lower than first coefficient W1.

First coefficient W1 and second coefficient W2 may be set using a value SRATE obtained by expressing priority SOC SMAIN as a percentage. Value SRATE is calculated using Expression 1 below:

$$SRATE=100 \cdot (SMAIN-SMN)/(SMX-SMN) \quad (1)$$

A width ΔW of the range where first coefficient W1 and second coefficient W2 are set to be equal is determined relative to an allowable error between first SOC S1 of first battery stack 110 and second SOC S2 of second battery stack 120. In the present embodiment, the allowable error between first SOC S1 of first battery stack 110 and second SOC S2 of second battery stack 120 is X % of the difference between upper limit value SMX and lower limit value SMN of SOC. Accordingly, width ΔW of the range where first coefficient W1 and second coefficient W2 are set to be equal is X % of the difference between upper limit value SMX and lower limit value SMN of SOC. Therefore, when priority SOC SMAIN falls within the range of X % of the difference between upper limit value SMX and lower limit value SMN, first coefficient W1 and second coefficient W2 are set to be equal. Herein, as shown in FIG. 9, Y=(SMX−SMN)·X/100 holds.

Figure 10:
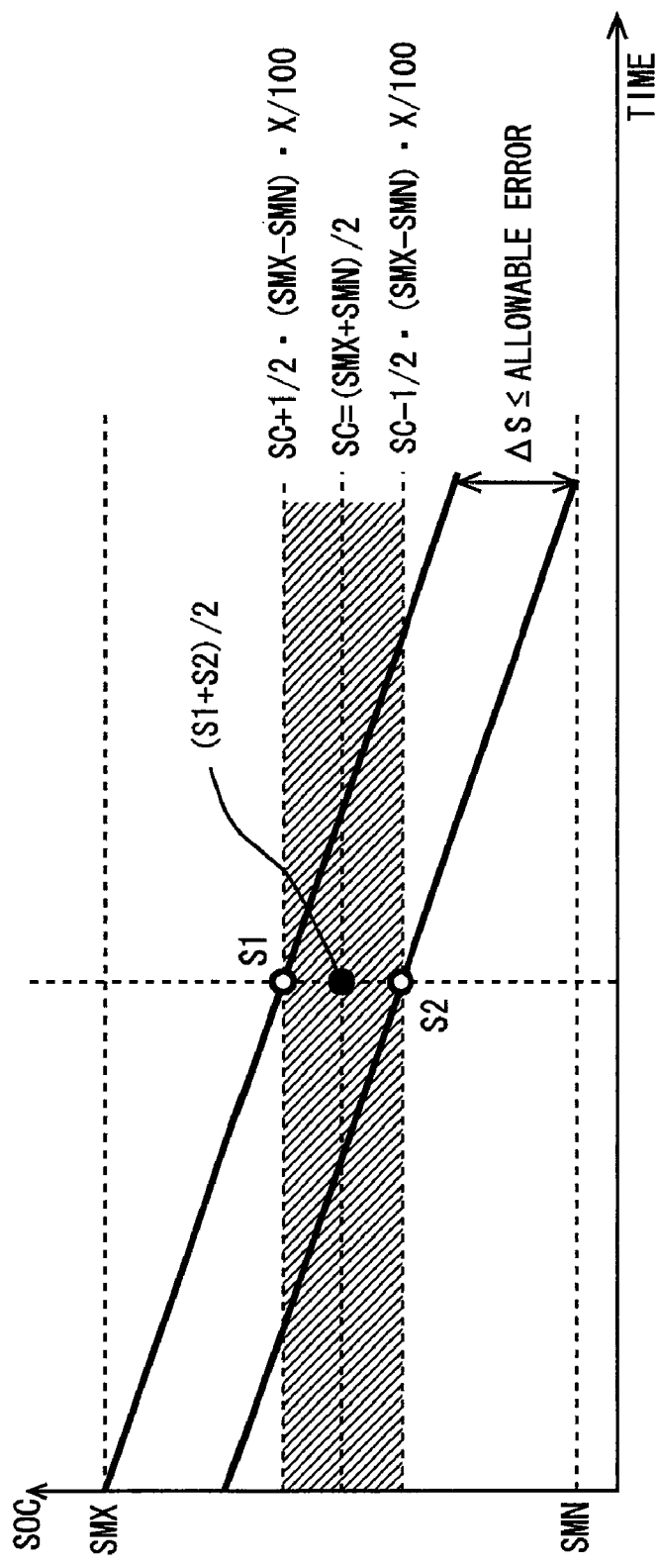
FIG. 10 is a diagram illustrating first state of charge S1 of the first battery stack and second state of charge S2 of the second battery stack when a difference ΔS between first state of charge S1 of the first battery stack and second state of charge S2 of the second battery stack is smaller than or equal to an allowable error.

As shown in FIG. 10, as long as a difference ΔS between first SOC S1 of first battery stack 110 and second SOC S2 of second battery stack 120 (ΔS=|S1−S2|) is smaller than or equal to the allowable error, priority SOC SMAIN falls within the range of X % relative to central value SC when the arithmetic average value of first SOC S1 of first battery stack 110 and second SOC S2 of second battery stack 120 is equal to central value SC. Therefore, first coefficient W1 and second coefficient W2 are set to be equal. That is, first coefficient W1 and second coefficient W2 are set to be equal before and after the SOC selected as priority SOC SMAIN is changed.

Figure 11:
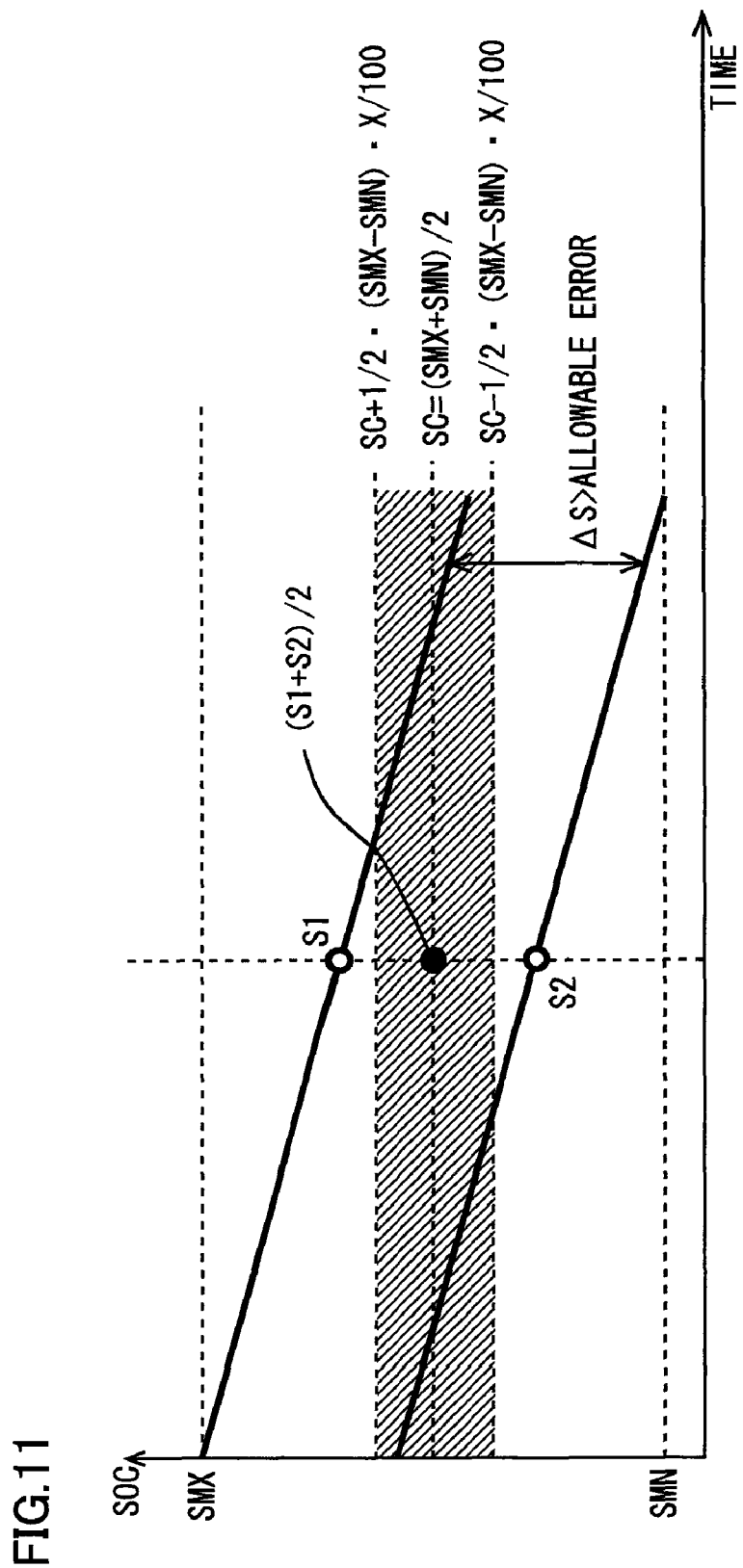
FIG. 11 is a diagram illustrating first state of charge S1 of the first battery stack and second state of charge S2 of the second battery stack when difference ΔS between first state of charge S1 of the first battery stack and second state of charge S2 of the second battery stack is larger than the allowable error.

In contrast, as shown in FIG. 11, in the case where difference ΔS between first SOC S1 of first battery stack 110 and second SOC S2 of second battery stack 120 is larger than the allowable error, priority SOC SMAIN may fall outside the range of X % relative to central value SC when the arithmetic average value of first SOC S1 of first battery stack 110 and second SOC S2 of second battery stack 120 is equal to central value SC. Therefore, first coefficient W1 and second coefficient W2 may be set to be different. That is, first coefficient W1 and second coefficient W2 may be set to be different before and after the SOC selected as priority SOC SMAIN is changed.

Accordingly, in the case where the difference between first SOC S1 of first battery stack 110 and second SOC S2 of second battery stack 120 is larger than the allowable error, first coefficient W1 and second coefficient W2 are set using a value obtained by correcting priority SOC SMAIN.

More specifically, priority SOC SMAIN is corrected using difference ΔS between first SOC S1 of first battery stack 110 and second SOC S2 of second battery stack 120 as well as width ΔW of the range where first coefficient W1 and second coefficient W2 are set to be equal.

Figure 12:
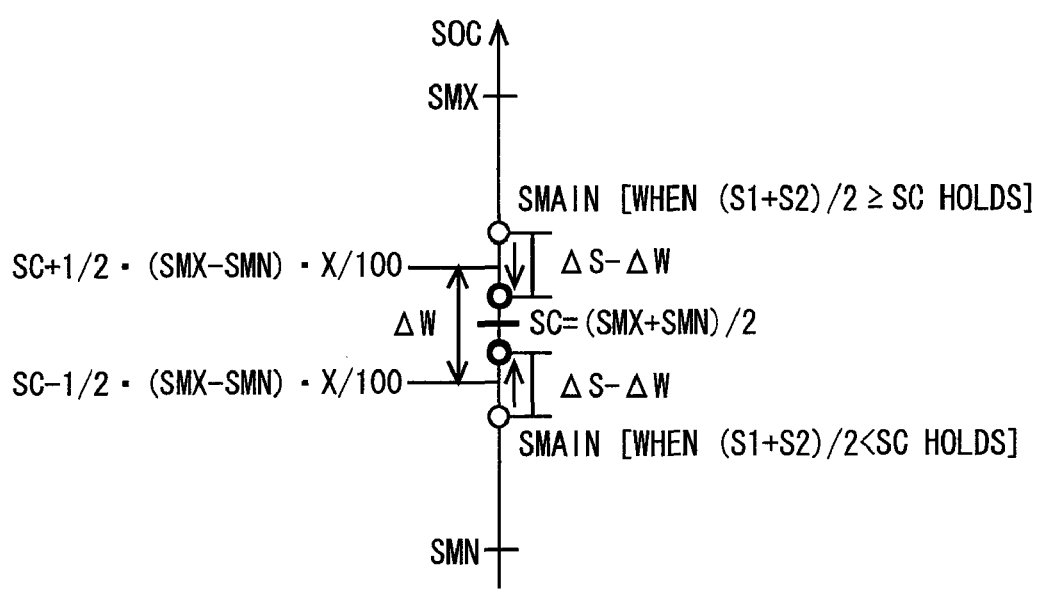
FIG. 12 is a diagram illustrating a priority state of charge SMAIN yet to be corrected and priority state of charge SMAIN having been corrected.

As shown in FIG. 12, priority SOC SMAIN is corrected so as to approach central value SC in accordance with the difference between difference ΔS and width ΔW (ΔS−ΔW). For example, priority SOC SMAIN is corrected so as to approach central value SC by the difference between difference ΔS and width ΔW. First coefficient W1 and second coefficient W2 are set in accordance with corrected priority SOC SMAIN.

Priority SOC SMAIN is thereby corrected such that priority SOC SMAIN falls within the above-mentioned range when the arithmetic average value of first SOC S1 of first battery stack 110 and second SOC S2 of second battery stack 120 is equal to central value SC. Therefore, first coefficient W1 and second coefficient W2 are set to be equal before and after the SOC selected as priority SOC SMAIN is changed.

In the case of setting first coefficient W1 and second coefficient W2 using value SRATE obtained by expressing priority SOC SMAIN as a percentage, a value obtained by correcting value SRATE is used to set first coefficient W1 and second coefficient W2.

Value SRATE is corrected using a corrected value SADJ calculated using Expression 2 below:

$$SADJ = 100 \cdot (SMAIN - SSUB)/(SMX - SMN) \quad (2)$$

When corrected value SADJ>X holds, "X" is subtracted from corrected value SADJ as shown in Expression 3 below:

$$SADJ = SADJ - X \quad (3)$$

As described above, "X" is the allowable error between first SOC S1 of first battery stack 110 and second SOC S2 of second battery stack 120. In other words, "X" is a value obtained by expressing an allowable upper limit of difference ΔS between first SOC S1 of first battery stack 110 and second SOC S2 of second battery stack 120 as a percentage relative to the difference between upper limit value SMX and lower limit value SMN.

When corrected value SADJ<−X holds, "X" is added to corrected value SADJ as shown in Expression 4 below:

$$SADJ = SADJ + X \quad (4)$$

When −X≦corrected value SADJ≦X holds, corrected value SADJ is set at "0".

As shown in Expression 5 below, value SRATE is corrected by subtracting corrected value SADJ from value SRATE:

$$SRATE = SRATE - SADJ \quad (5)$$

Correcting value SRATE in this manner is substantially the same as correcting priority SOC SMAIN so as to approach central value SC by the difference between difference ΔS and width ΔW. Therefore, value SRATE corrected as described above may be used to set first coefficient W1 and second coefficient W2.

Referring back to FIG. 6, calculation unit 504 adds the product of first coefficient W1 and priority SOC SMAIN to the product of second coefficient W2 and sub SOC SSUB, to thereby calculate total SOC STOTAL of the power storage system. More specifically, total SOC STOTAL of the power storage system is calculated using Expression 6 below:

$$STOTAL = W1 \cdot SMAIN + W2 \cdot SSUB \quad (6)$$

More specifically, total SOC STOTAL of the power storage system is calculated as a weighted average value of first SOC S1 of first battery stack 110 and second SOC S2 of second battery stack 120.

Expression 6 may be expressed as Expression 7 below using first coefficient W1 alone instead of second coefficient W2:

$$STOTAL = W1 \cdot SMAIN + (1 - W1) \cdot SSUB \quad (7)$$

Figure 13:
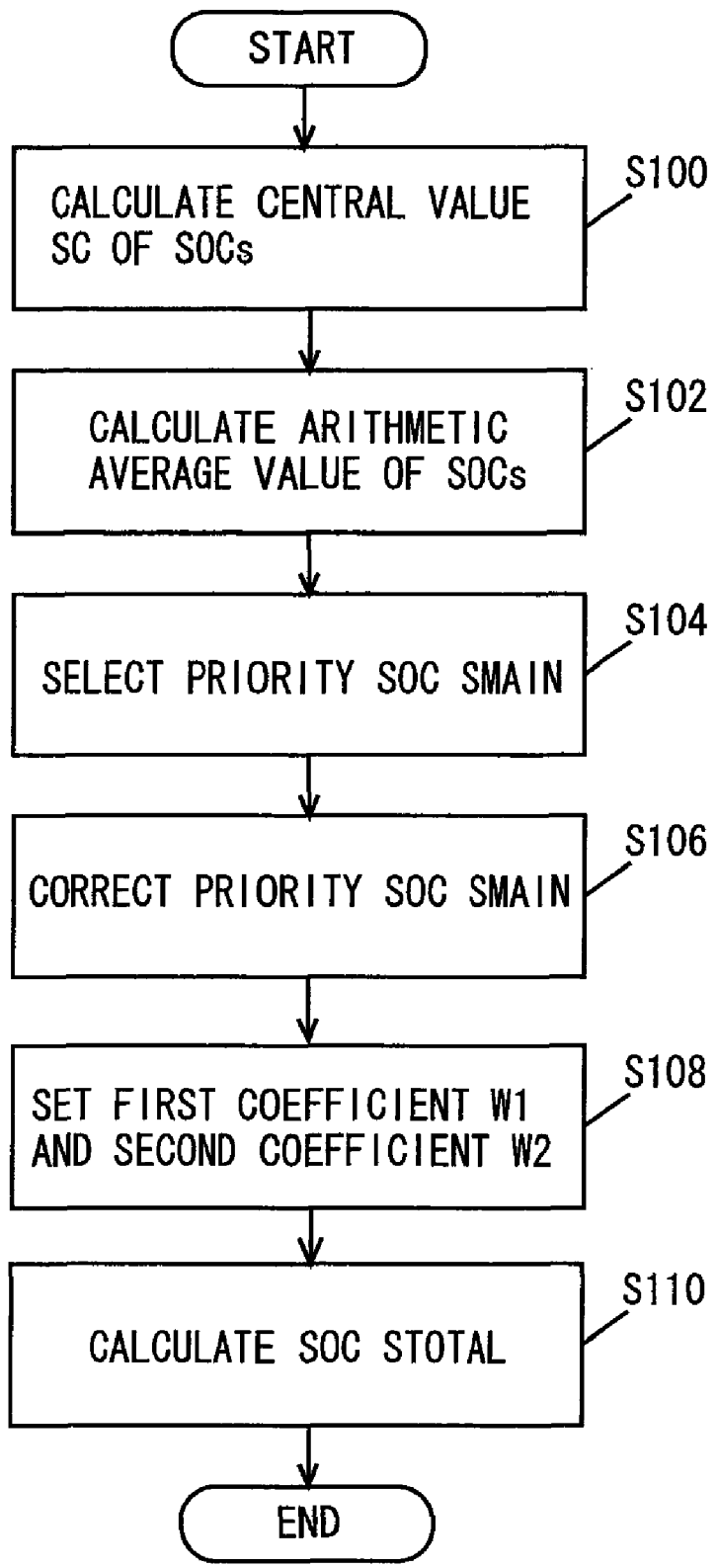
FIG. 13 is a flow chart illustrating a process executed by the ECU.

With reference to FIG. 13, the process executed by ECU 130 for calculating total SOC STOTAL of the power storage system will now be described.

At a step (hereinafter step is abbreviated to S) 100, ECU 130 calculates central value SC of the SOCs.

At S102, ECU 130 calculates the arithmetic average value of first SOC S1 of first battery stack 110 and second SOC S2 of second battery stack 120.

At S104, ECU 130 selects priority SOC SMAIN.

At S106, ECU 130 corrects priority SOC SMAIN when the difference between first SOC S1 of first battery stack 110 and second SOC S2 of second battery stack 120 is larger than the allowable error.

At S108, ECU 130 sets first coefficient W1 and second coefficient W2 in accordance with priority SOC SMAIN.

At S110, ECU 130 adds the product of first coefficient W1 and priority SOC SMAIN to the product of second coefficient W2 and sub SOC SSUB, to thereby calculate total SOC STOTAL of the power storage system.

Figure 14:
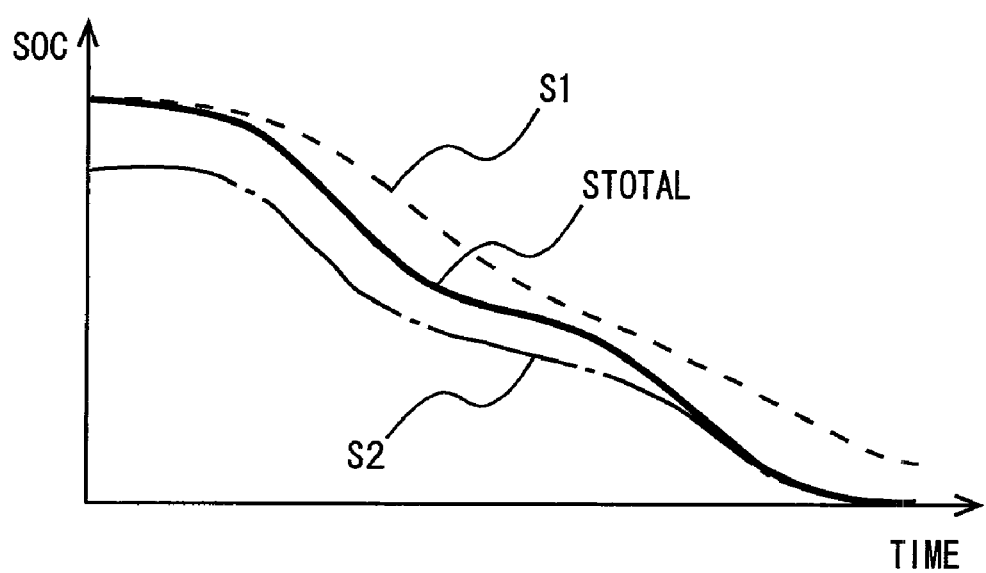
FIG. 14 is a diagram illustrating a total state of charge STOTAL of the power storage system.

Total SOC STOTAL of the power storage system calculated based on the above structure and flow chart will now be described further with reference to FIG. 14. In FIG. 14, the solid line represents total SOC STOTAL of the power storage system. The broken line represents first SOC S1 of first battery stack 110. The long-dashed short-dashed line represents second SOC S2 of second battery stack 120. In FIG. 14, by way of example, it is assumed that first SOC S1 of first battery stack 110 is higher than second SOC S2 of second battery stack 120.

In the present embodiment, when the sum of first SOC S1 of first battery stack 110 and second SOC S2 of second battery stack 120 is large, a higher SOC is selected as priority SOC SMAIN. If priority SOC SMAIN is above the range of X % relative to central value SC, first coefficient W1 is set to be higher than second coefficient W2. Therefore, total SOC STOTAL calculated by adding the product of first coefficient W1 and priority SOC SMAIN to the product of second coefficient W2 and sub SOC SSUB approaches the higher SOC, that is, first SOC S1 of first battery stack 110, as shown in FIG. 14. Accordingly, SOC STOTAL is calculated to be relatively high.

In contrast, when the sum of first SOC S1 of first battery stack 110 and second SOC S2 of second battery stack 120 is small, a lower SOC is selected as priority SOC SMAIN. If priority SOC SMAIN is below the range of X % relative to central value SC, first coefficient W1 is set to be higher than second coefficient W2. Therefore, total SOC STOTAL calculated by adding the product of first coefficient W1 and priority SOC SMAIN to the product of second coefficient W2 and the other sub SOC SSUB approaches the lower SOC, that is, second SOC S2 of second battery stack 120, as shown in FIG. 14. Accordingly, SOC STOTAL is calculated to be relatively low.

Total SOC STOTAL taking into consideration the difference in SOC between the respective battery stacks is thereby calculated.

When the arithmetic average value of first SOC S1 of first battery stack 110 and second SOC S2 of second battery stack 120 is large, total SOC STOTAL is calculated such that the higher SOC increases toward upper limit value SMX, so that the state in which one of the SOCs is close to upper limit value SMX is shown.

In contrast, when the arithmetic average value of first SOC S1 of first battery stack 110 and second SOC S2 of second battery stack 120 is large, total SOC STOTAL is calculated such that the lower SOC decreases toward lower limit value SMN, so that the state in which one of the SOCs is close to lower limit value SMN is shown.

Accordingly, by using total SOC STOTAL calculated in the present embodiment, it is possible to show that one of the SOCs is close to upper limit value SMX or lower limit value SMN. Charging or discharging can thereby be suitably limited.

Since first coefficient W1 and second coefficient W2 are set to be equal before and after the SOC selected as priority SOC SMAIN is changed, total SOC STOTAL is calculated so as to be equal before and after the SOC selected as priority SOC SMAIN is changed. This can ensure continuousness of calculated total SOC STOTAL, as shown in FIG. 14. Accordingly, when calculating the distance that the vehicle can run from total SOC STOTAL, the distance that the vehicle can run can be calculated continuously. In other words, it is possible to avoid a sudden significant change in the distance that the vehicle can run.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An apparatus for calculating a state of charge of a power storage system provided with a first power storage device and a second power storage device, the apparatus comprising:
a device to calculate a first state of charge of said first power storage device;
a device to calculate a second state of charge of said second power storage device;
a selection device to select a higher one of said first state of charge and said second state of charge when a sum of said first state of charge and said second state of charge is larger than or equal to a predetermined first value, and to select a lower one of said first state of charge and said second state of charge when the sum of said first state of charge and said second state of charge is smaller than said first value;
a setting device to set a first coefficient in accordance with a selected state of charge, and set a second coefficient so as to be lower than said first coefficient; and
a calculation device to add a product of said first coefficient and said selected state of charge to a product of said second coefficient and the other state of charge, to thereby calculate the state of charge of said power storage system.

2. The apparatus according to claim 1, wherein
said first value is a value twice a predetermined second value, and
said selection device is to select a higher one of said first state of charge and said second state of charge when an arithmetic average value of said first state of charge and said second state of charge is larger than or equal to said second value, and selects a lower one of said first state of charge and said second state of charge when the arithmetic average value of said first state of charge and said second state of charge is smaller than said second value.

3. The apparatus according to claim 2, wherein said setting device is to set said first coefficient and said second coefficient to be equal when said selected state of charge falls within a predetermined range where said second value is centered.

4. The apparatus according to claim 3, wherein when a first difference between said first state of charge and said second state of charge is larger than a width of said predetermined range, said setting device is to set said first coefficient and said second coefficient in accordance with a value obtained by correcting said selected state of charge so as to approach said second value in accordance with a second difference between said first difference and the width of said predetermined range.

5. The apparatus according to claim 2, wherein said setting device is to set said first coefficient and said second coefficient such that said first coefficient increases and said second coefficient decreases as a difference between said selected state of charge and said second value increases.

6. The apparatus according to claim 2, wherein said second value is an arithmetic average value of an upper limit value and a lower limit value of the states of charge of said first power storage device and said second power storage device.

7. An electric system comprising:
a first power storage device;
a second power storage device; and
a control unit that
calculates a first state of charge of said first power storage device,
calculates a second state of charge of said second power storage device,
selects a higher one of said first state of charge and said second state of charge when a sum of said first state of charge and said second state of charge is larger than or equal to a predetermined first value, and selects a lower one of said first state of charge and said second state of charge when the sum of said first state of charge and said second state of charge is smaller than said first value,
sets a first coefficient in accordance with a selected state of charge, and sets a second coefficient so as to be lower than said first coefficient, and
adds a product of said first coefficient and said selected state of charge to a product of said second coefficient and the other state of charge, to thereby calculate a state of charge of said power storage system.

* * * * *